United States Patent
Saito et al.

(10) Patent No.: US 7,058,370 B2
(45) Date of Patent: Jun. 6, 2006

(54) TRANSMISSION POWER AMPLIFIER UNIT

(75) Inventors: Yutaka Saito, Sapporo (JP); Ayanori Matsuda, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 519 days.

(21) Appl. No.: 10/059,811

(22) Filed: Jan. 29, 2002

(65) Prior Publication Data

US 2002/0086709 A1 Jul. 4, 2002

Related U.S. Application Data

(63) Continuation of application No. PCT/JP99/05358, filed on Sep. 30, 1999.

(51) Int. Cl.
*H04B 1/04* (2006.01)

(52) U.S. Cl. .................. 455/114.3; 455/67.13; 455/194.2; 455/293; 455/295; 455/311; 455/424; 455/501; 45/561

(58) Field of Classification Search ........... 755/446, 755/422.1, 423.1, 424, 44.9, 453, 63.1, 561, 755/115.3, 235.1–240.1, 249.1; 455/1, 63.1, 455/67.13, 115.3, 194.2, 235.1, 240.1, 249.1, 455/293, 295, 311, 422.1, 423, 424, 446, 455/449, 453, 501, 561

See application file for complete search history.

(56) References Cited

U.S. PATENT DOCUMENTS

| 5,475,870 A | * | 12/1995 | Weaver et al. ............ 455/67.11 |
| 5,584,049 A | | 12/1996 | Weaver, Jr. et al. |
| 5,884,187 A | * | 3/1999 | Ziv et al. .................... 455/522 |
| 6,286,994 B1 | * | 9/2001 | Boesel et al. ................ 374/146 |
| 6,370,109 B1 | * | 4/2002 | Schwartz et al. ............ 370/203 |
| 6,397,070 B1 | * | 5/2002 | Black ............................. 455/453 |
| 6,411,825 B1 | * | 6/2002 | Csapo et al. ................. 455/561 |
| 6,415,132 B1 | * | 7/2002 | Sabat, Jr. .................... 455/3.01 |

FOREIGN PATENT DOCUMENTS

JP 07245541 9/1995

* cited by examiner

*Primary Examiner*—William Trost
*Assistant Examiner*—James D. Ewart
(74) *Attorney, Agent, or Firm*—Katten Muchin Rosenman LLP

(57) ABSTRACT

A transmission power amplifier unit of a base-station apparatus for compensating for non-linear distortion of a transmission power amplifier by feed-forward control is provided with a gain varying unit for varying gain of the transmission power amplifier unit. At start-up of the transmission power amplifier unit, a controller determines whether the base-station apparatus is in a blossoming mode or breathing mode, maximizes gain of the transmission power amplifier unit by controlling the gain varying unit if the mode is the blossoming mode and increases the gain gradually in proportion to the passage of time if the mode is the breathing mode.

7 Claims, 17 Drawing Sheets

FIG. 1A
BLOSSOMING MODE

FIG. 1B
BREEZING MODE

FIG. 10

| TIME | IDEAL VALUE |
|---|---|
| $t_1$ | $V_1$ |
| $t_2$ | $V_2$ |
| $t_3$ | $V_3$ |
| $t_4$ | $V_4$ |
| $t_5$ | $V_5$ |
| $t_6$ | $V_6$ |
| $t_7$ | $V_7$ |
| ALLOWABLE RANGE : $\alpha$ | |

US 7,058,370 B2

TRANSMISSION POWER AMPLIFIER UNIT

This application is a continuation of international application number PCTJP99/05358, filed Sep. 30, 1999.

BACKGROUND OF THE INVENTION

This invention relates to a transmission power amplifier unit and, more particularly, to a transmission power amplifier unit, which has a transmission power amplifier, for compensating for non-linear distortion of the transmission power amplifier by feed-forward control.

Frequency resources have become tight in recent years and in wireless communications there is growing use of high-efficiency transmission using digital techniques. In instances where multilevel amplitude modulation is applied to wireless communications, a vital technique is one which can suppress non-linear distortion by linearizing the amplitude characteristic of the power amplifier on the transmitting side and reduce the leakage of power between adjacent channels. Also essential is a technique which compensates for the occurrence of distortion that arises when an attempt is made to improve power efficiency by using an amplifier that exhibits poor linearity.

FIG. 12 is a block diagram of a CDMA transmitter in a base-station control apparatus for encoding, multiplexing and transmitting transmit data of control and user channels. Spread-spectrum modulators $1_1$ to $1_n$ of respective channels (control/user channels) each have a serial/parallel (S/P) converter $1a$, spreading circuits $1b$, $1c$ and a spreading code generator $1d$. The S/P converter $1a$ divides transmit data alternately one bit at a time to convert the data to two sequences $D_I$, $D_Q$, namely in-phase component (I-component) data and quadrature-component (Q-component) data, respectively. The spreading code generator $1d$ generates a specific spreading code that conforms to the base station and channel, and the spreading circuits $1b$, $1c$ multiply the data $D_I$, $D_Q$ by the spreading code to apply spread-spectrum modulation to the data.

A combiner $2_1$ outputs an I-component code-multiplexed signal $\Sigma V_I$ by combining I-component spread-spectrum modulated signals $V_I$ output by the respective spread-spectrum modulators $1_1 \sim 1_n$, and a combiner $2_2$ outputs a Q-component code-multiplexed signal $\Sigma V_Q$ by combining Q-component spread-spectrum modulated signals $V_Q$ output by the respective spread-spectrum modulators $1_1 \sim 1_n$. DA converters $3_1$, $3_2$ subject the outputs of the respective combiners to a DA conversion, and a quadrature modulator 4 applies QPSK quadrature modulation to the code-multiplexed signals $\Sigma V_I$, $\Sigma V_Q$ of the I and Q components and outputs a modulated signal. An IF circuit 5 multiplies the quadrature-modulated signal and passes signal components of a prescribed intermediate-frequency band. A frequency converter 6 mixes the intermediate-frequency signal that is output from the IF circuit with a local-oscillator signal to effect a frequency conversion to a high-frequency signal (an IF→RF conversion). An RF circuit 7 amplifies the RF signal obtained by the frequency conversion, passes signal components of a prescribed high-frequency band and inputs the components to a transmission power amplifier 9 via a variable attenuator (ATT) 8. The transmission power amplifier 9 amplifies the power of the RF signal output by the variable attenuator 8 and radiates the amplified signal into space from an antenna 10.

The transmission power amplifier 9 includes, on a per-sector basis, one brancher $9a$, two or three high-power amplifiers (HPA) $9b_1$, $9b_2$, $9b_3$, and a combiner $9c$ for combining the outputs of the high-power amplifiers, and is adapted so as to cover a cell of a requisite radius. A sector is a divided area obtained by dividing a 360° area surrounding the base station into a plurality of zones. For example, if the 360° area is divided at intervals of 120°, three sectors will exist.

When a new base station is established or base stations are increased in number, a transmission power controller 11 of the new base station gradually increases transmission power up to a stipulated value, as shown in FIG. 13, in accordance with a command from a monitoring control panel 12, whereby the cell is enlarged at a fixed rate. More specifically, when a station is established, the transmission power controller 11 gradually lowers the attenuation of the variable attenuator 8 from MAX to MIN taking a pre-set time TS, thereby enlarging the cell radius at a fixed rate. Control for regulating transmission power to enlarge the cell ratio at a fixed rate when a station is established is referred to as blossoming control, and control at the time of ordinary operation following the completion of blossoming control is referred to as breathing control. The goals of enlarging a cell at a fixed rate by blossoming control are as follows:

(1) to avoid concentration of load in call processing;

(2) to control the outputs of transmitter and receiver (base station and terminals) smoothly; and (3) to mitigate the effects on terminals within the cell and on other base stations when a station is established. In other words, if a large amount of power is suddenly output to enlarge a cell when a station is established, calls from a large number of terminals concentrate at one time, call processing cannot keep pace and a variety of problems arise. Accordingly, the cell is enlarged at a fixed rate to increase the cell radius gradually.

In this case, it is necessary that transmittable and receivable areas be equalized. Otherwise reception will not be possible even if transmission is or transmission will not be possible even if reception is. For this reason, by using blossoming control, the receivable area is increased gradually at the rate at which the cell (transmittable area) is enlarged by gradually increasing transmission power. In order to increase the receivable area gradually, first noise is introduced to the receive port of the base station and it is so arranged that distant radio waves cannot be received, then noise is reduced at the rate at which the transmittable area is enlarged to thereby gradually enlarge the receivable area.

The input/output characteristic of the transmission power amplifier (main amp) constituting the high-power amplifiers $9b_1$ to $9b_3$ is non-linear, as indicated by the dashed line in FIG. 14A. Non-linear distortion arises as a result of this non-linear characteristic, the frequency spectrum in the vicinity of a transmission frequency $f_0$ develops side lobes, as indicated by the dashed line in FIG. 14B, leakage into the adjacent channel occurs and this causes interference between adjacent channels. Feed-forward control is known as a technique which compensates for such non-linear distortion of a transmission power amplifier.

FIG. 15 is a diagram showing the structure of a high-power amplifier (HPA) which compensates for non-linear distortion of a transmission power amplifier by feed-forward control, and FIG. 16 shows the frequency spectra of various portions of the high-power amplifier in a case where two carrier signals $SC_1$, $SC_2$ (denoted collectively by SC) are frequency-multiplexed and transmitted.

A control unit (CPU) 20 exercises feed-forward control so as to compensate for non-linear distortion of the transmission power amplifier (main amp). When the high-power amplifier starts up (i.e., when power is introduced), a variable attenuator 21 gradually lowers its attenuation from MAX to MIN (i.e., gradually raises its gain) under the control of the control unit 20, thereby making it possible to cancel the distortion promptly. In addition, this prevents damage caused by input of excessive power to an auxiliary amplifier (sub-amp), described later.

A brancher 22 branches the carrier signals SC (A of FIG. 16) to two signal paths a, b, and a combiner 23 combines the carrier signals SC with a pilot signal SP of a prescribed frequency (B of FIG. 16). A variable attenuator 24 and a variable phase shifter 25 adjust attenuation and phase under control of the control unit 20 so as to equalize the gains of the signal paths a and b and invert phase.

A main amp 26 amplifies the output of the phase shifter 25. Noise signals $SN_1$, $SN_2$ (C of FIG. 16) appear at the amplifier output owing to non-linear distortion of the main amp. A brancher 27 branches, to signal paths c and d, a noise signal and the carrier signal, which includes the pilot signal, output from the main amp.

A combiner 28 combines the signal branched by the brancher 27 with a signal delayed by a delay line 29. Since control is performed so as to equalize the gains of the signal paths a and b and so as to invert phase, the combiner 28 outputs the difference between the signals that arrive via the paths a and b. Since the signal path b includes only the distortion-free delay line 29, the combiner 28 outputs the noise components $SN_1$, $SN_2$ and the pilot signal SP (D of FIG. 16), which occur on the signal path a, in the steady state of feed-forward control.

A variable attenuator 30 and a variable phase shifter 31 adjust attenuation and phase under control of the control unit 20 so as to equalize the gains of the signal paths c and d and invert phase. A sub-amp 32 amplifies the output of the variable phase shifter 31. A combiner 33 combines the signal, which has been branched by the brancher 27 and delayed by a delay line 34, with the output signal of the sub-amp. Since control is performed so as to equalize the gains of the signal paths c and d and so as to invert phase, the combiner 33 outputs the difference between the signals that arrive via the paths c and d. The signal path c includes only the distortion-free delay line 34 so that the noise signals $SN_1$, $SN_2$ and the carrier signals SC inclusive of the pilot signal SP (C in FIG. 16) enter the combiner 33 as is. Signal path d, on the other hand, inputs the noise components $SN_1$, $SN_2$ and pilot signal SP to the combiner 33. As a result, the combiner 33 outputs only the carrier signals $SC_1$, $SC_2$ (E of FIG. 16) in the steady state of feed-forward control.

The foregoing is for an ideal case in the steady state. When feed-forward control is unstable, the carrier signals SC are not removed and remain in the output of the combiner 28, and the pilot signal SP is not removed and remains in the output of combiner 33. A detector 35 detects the carrier-signal components contained in the output of the sub-amp 32 and inputs these components to the control unit 20. A detector 36 detects the pilot-signal component contained in the output of the combiner 33 and inputs this component to the control unit 20. The latter controls the attenuation and amount of phase shift of the variable attenuator 24 and variable phase shifter 25 in such a manner that the carrier-signal components detected by the detector 35 are minimized, and controls the attenuation and amount of phase shift of the variable attenuator 30 and variable phase shifter 31 in such a manner that the pilot-signal component detected by the detector 36 becomes zero. By thenceforth executing such feed-forward control, an amplified signal from which noise signals ascribable to non-linear distortion have been eliminated can be output from the combiner 33.

It is required that the high-power amplifier (HPA) having the above-described feed-forward control function be started up by turning on a power supply when the amplifier board is replaced during operation and at the time of maintenance. At start-up, an input signal (carrier signal) the level of which is near the rated level enters. Further, in feed-forward control, considerable time is required for the carrier signal contained in the output of the combiner 28 to decrease. As a consequence, there are instances where the signal having the level close to the rated level enters the sub-amp 32 and destroys the sub-amp when power is introduced. Further, in feed-forward control, a comparatively long period of time is required to settle in the steady state if a large signal is suddenly applied.

With the conventional high-power amplifier (HPA), therefore, the attenuation of the variable attenuator 21 is set to MAX at introduction of power in order to prevent destruction of the sub-amp and exercise distortion cancellation control quickly. Following the introduction of power, the attenuation of the variable attenuator 21 is reduced gradually from MAX to MIN (=0), under control of the control unit 20, from the moment the input-signal level surpasses the set level (=$V_{FCC}$) near the rated level.

The high-power amplifier starts up upon introduction of power when a station is established. The above-mentioned attenuation control by the control unit 20 therefore is carried out in parallel with blossoming control at the time of station establishment, and output power $S_{OUT}$ of the high-power amplifier (HPA) loses its linearity at time td, which is the time at which the input power $S_{IN}$ surpasses the set level $V_{FCC}$, as opposed to the input power $S_{IN}$ (see FIG. 17) that varies linearly owing to blossoming control. If the transmission power $S_{OUT}$ of the base station ceases varying linearly with respect to time, then it is no longer possible to exercise the original control that attempts to enlarge the cell (the transmit area) gradually in proportion to time. Ideally, it is required that control be performed in such a manner that the transmission power of the base station will be as indicated by the dashed line $S_{IDL}$.

If original power control can no longer be exercised, as mentioned above, the above-mentioned goals of blossoming control when a station is established can no longer be attained. A particular problem is that since the base station that establishes the link is changed over owing to the reception power of the mobile terminal, the base station that establishes the link will be changed over frequently unless transmission power control of the base station is performed smoothly when a station is set up. A further problem is that a difference develops between the transmittable area and receivable area so that, depending upon the region, transmission is possible but reception is not, or vice versa.

SUMMARY OF THE INVENTION

Accordingly, an object of the present invention increase the transmission power of a high-power amplifier linearly with time when a station is established.

Another object of the present invention is to so arrange it that when power is introduced to a high-power amplifier (i.e., when the amplifier is started up), an excessive current will not enter a sub-amp and cause destruction of the sub-amp, and to so arrange it that non-linear distortion of a main amp can be compensated for quickly.

A transmission power amplifier unit of a base-station apparatus for compensating for non-linear distortion of a transmission power amplifier by feed-forward control is provided with (1) a gain varying unit for varying gain of the transmission power amplifier unit, and (2) a controller for controlling the gain varying unit. At start-up of (introduction of power to) the transmission power amplifier unit, the controller determines whether the base-station apparatus is in a blossoming mode or breathing mode, maximizes gain of the transmission power amplifier unit if the mode is the blossoming mode and increases the gain of the transmission power amplifier unit gradually if the mode is the breathing mode.

The gain varying unit is an attenuator the attenuation of which is variable. The controller increases the gain of the transmission power amplifier unit gradually by gradually decreasing the attenuation of the attenuator. Further, the controller detects input power to or output power from the transmission power amplifier unit and determines whether the mode is the blossoming mode or breathing mode based upon whether or not the detected value is equal to or greater than a threshold value.

If the above arrangement is adopted, the transmission power amplifier unit holds the gain constant at establishment of a station because the base station will be in the blossoming mode. When a station is established, therefore, output power (transmission power) of the transmission power amplifier unit can be increased linearly with time. Further, when power is introduced to a transmission power amplifier unit replaced for the sake of testing or maintenance, the base station is in the breathing mode and, hence, the transmission power amplifier unit gradually raises gain. As a result, it can be so arranged that a sub-amp will not be destroyed owing to input of excessive power. moreover, non-linear distortion of a main amp can compensated for quickly.

BRIEF DESCRIPTION OF THE DRAWINGS

FIG. 1A and FIG. 1B are diagrams useful in describing control of the gain of a high-power amplifier according to the present invention;

FIG. 10 is a correspondence table of correspondence between elapsed time and ideal values of transmission power;

Figure 2:
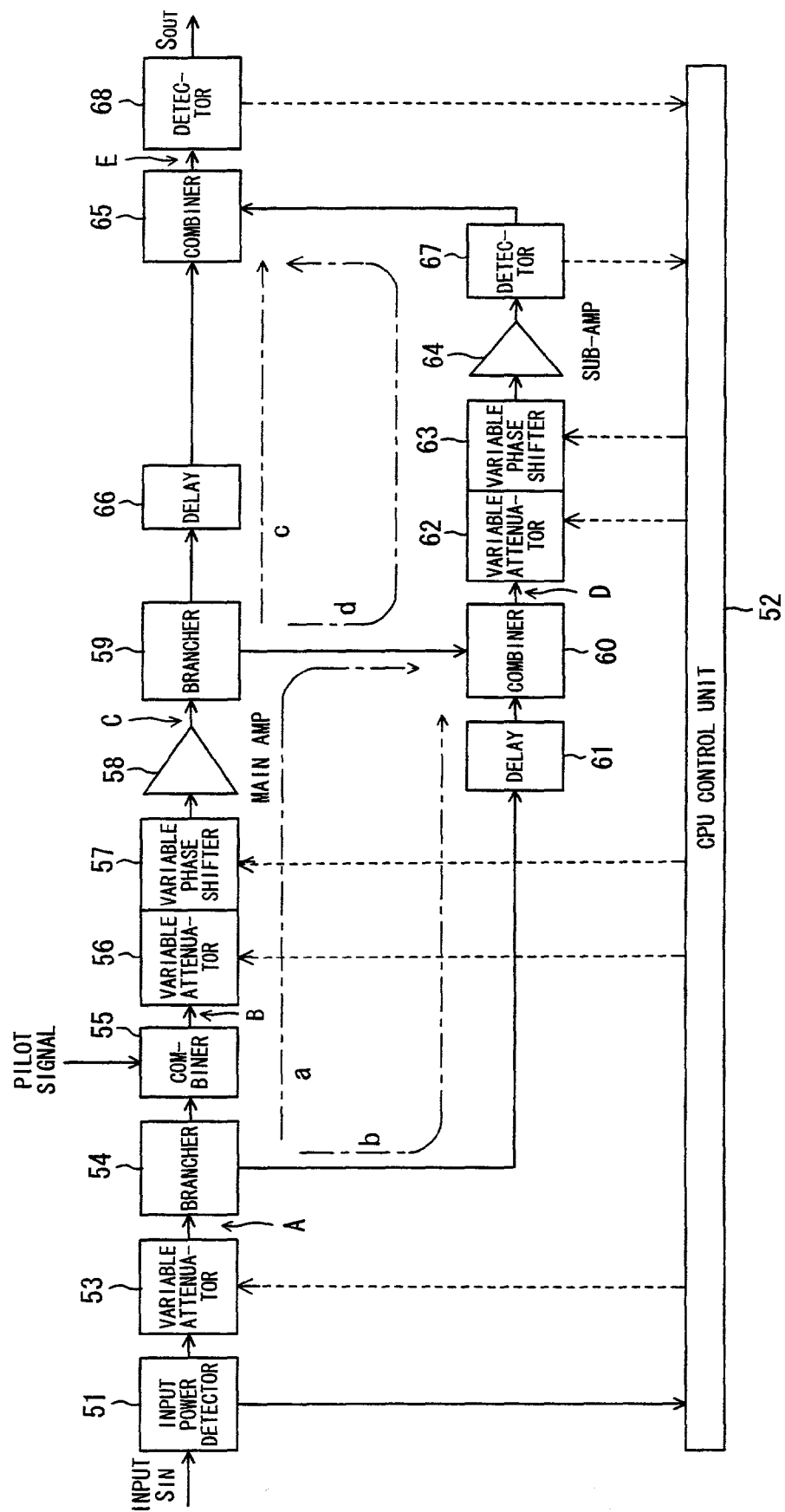
FIG. 2 is a diagram showing the structure of a high-power amplifier according to a first embodiment.

DESCRIPTION OF THE PREFERED EMBODIMENTS (A) Overview of the Present Invention The present invention (1) holds the gain of a high-power amplifier constant (at full gain) and increases output power in proportion to the passage of time when a station is established (at the time of blossoming), and (2) gradually raises gain of the high-power amplifier so that excessive voltage will not enter a sub-amp, thereby protecting the same, when the high-power amplifier is replaced during operation (breathing).

Figures 1A, 1B:
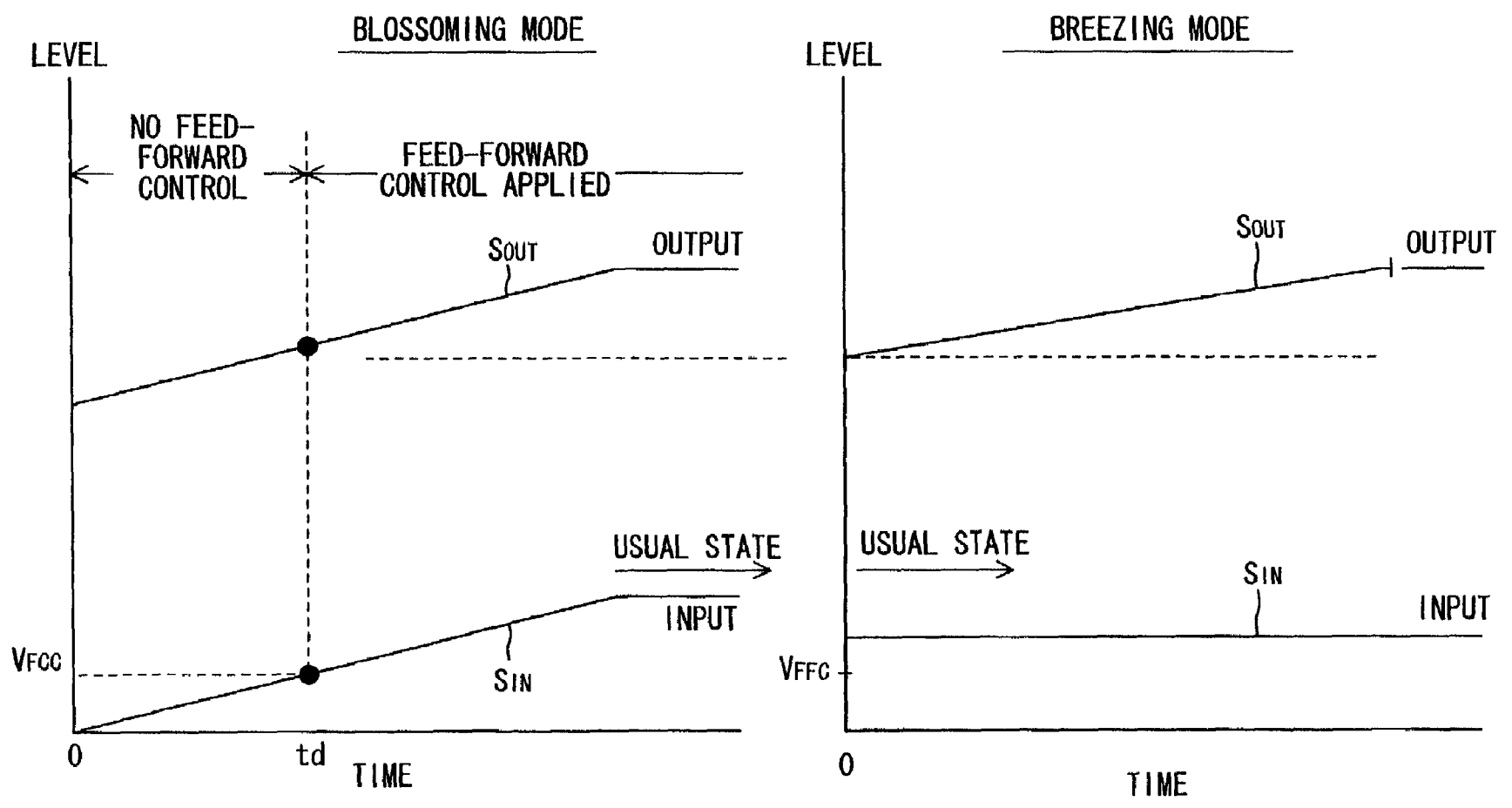

FIG. 1A and FIG. 1B are diagrams useful in describing control of the gain of a high-power amplifier according to the present invention.

When a station is established (i.e., at the time of blossoming), input power $S_{IN}$ to a high-power amplifier increases linearly from a lower limit to an upper limit of a rated input level, as indicated in FIG. 1A. This gradual increase in input power is equivalent to a gradual increase in gain of the high-power amplifier. When a station is established (i.e., at the time of blossoming), therefore, it is unnecessary to gradually increase the gain of the high-power amplifier from low gain to full gain; the amplifier can be set to full gain immediately. As a result, output power $S_{OUT}$ of the high-power amplifier also increases in proportion to the passage of time in a manner similar to that of the input power. Initially, the high-power amplifier performs amplification without applying feed-forward control and starts control from a point at which a distortion guarantee is required. For example, the amplifier executes feed-forward control from a time td at which the level of input power $S_{IN}$ exceeds a set level $V_{FCC}$.

At the time of operation (i.e., at breathing), the input power $S_{IN}$ to the high-power amplifier is fairly large, as indicated in FIG. 1B. When the high-power amplifier is replaced during operation (breathing), therefore, the gain of the high-power amplifier is lowered to protect the sub-amp, then gain is raised gradually from low gain to full gain. Further, since the input power $S_{IN}$ is greater than the set level $V_{FCC}$, feed-forward control is executed from the start. If this arrangement is adopted, excessive power is not input to the sub-amp, thereby making it possible to protect the same, when feed-forward control is unstable. The output power $S_{OUT}$ of the high-power amplifier increases in accordance with the passage of time.

Thus, when the high-power amplifier is started up, the base-station apparatus determines whether the prevailing mode is the blossoming mode or the breathing mode, fixes the gain of the high-power amplifier at full gain if the mode is the blossoming mode and increases the gain of the high-power amplifier gradually if the mode is the breathing mode. As for whether the mode is the blossoming mode or breathing mode, the blossoming mode is in effect if the input power at start-up (time 0) is less than the set level and the breathing mode is in effect if the input power is equal to or greater than the set level, as apparent from FIG. 1A and FIG. 1B.

(B) First Embodiment

FIG. 2 is a diagram showing the structure of a high-power amplifier (HPA) according to a first embodiment of the present invention.

Figure 3:
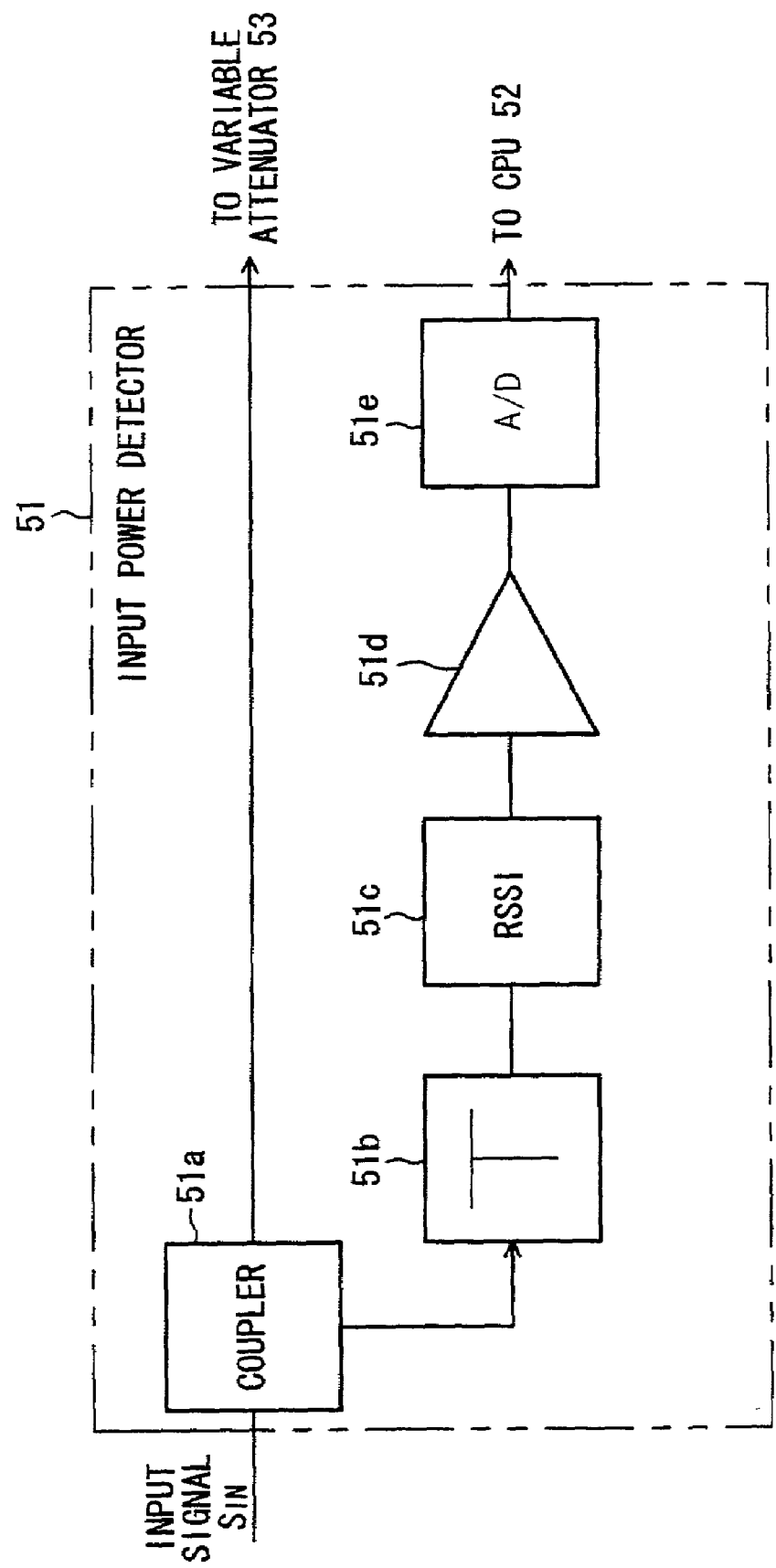
FIG. 3 is a diagram showing the structure a level detector.

An input power detector 51, which is provided on the input side of the high-power amplifier, detects the input power SIN and inputs the result to a control unit 52. FIG. 3 is a diagram showing the structure of the level detector 51. The input power $S_{IN}$ is branched by a coupler 51a such as a unidirectional coupler, and one branched signal is input to a variable attenuator 53. The other branched signal is input to an RSSI (Receive Signal Strength Indicator) circuit 51c via an isolator 51b. The RSSI circuit 51c converts the power of the input signal to voltage and inputs the voltage to an amplifier 51d, where the signal is subjected to the necessary amplification and then input to an AD converter 51e. The AD converter 51e converts the input voltage to a digital signal and inputs the digital signal to the control unit 52.

The control unit (CPU) 52 executes feed-forward control and, at start-up, determines whether the prevailing mode is the blossoming mode or the breathing mode and controls the gain of the high-power amplifier in accordance with the mode discriminated.

In accordance with whether the mode is the blossoming mode or the breathing mode, the variable attenuator 53 gradually lowers its attenuation from MAX to MIN, i.e., gradually raises its gain from MIN to MAX, or fixes its attenuation at MIN (fixes its gain at MAX) under the control of the control unit 52.

A brancher 54 branches the carrier signals to two signal paths a, b, and a combiner 55 combines the carrier signals with a pilot signal of a prescribed frequency. A variable attenuator 56 and a variable phase shifter 57 adjust attenuation and phase under control of the control unit 52 so as to equalize the gains of the signal paths a and b and invert phase.

A main amp 58 amplifies the output of the phase shifter 57. Noise signals appear at the amplifier output owing to non-linear distortion of the main amp. A brancher 59 branches, to signal paths c and d, a noise signal and the carrier signal, which includes the pilot signal, output from the main amp.

A combiner 60 combines the signal branched by the brancher 59 with a signal delayed by a delay line 61. Since control is performed so as to equalize the gains of the signal paths a and b and so as to invert phase, the combiner 60 outputs the difference between the signals that arrive via the paths a and b. Since the signal path b includes only the distortion-free delay line 61, the combiner 60 outputs the noise components and the pilot signal, which occur on the signal path a, in the steady state of feed-forward control.

A variable attenuator 62 and a variable phase shifter 63 adjust attenuation and phase under control of the control unit 52 so as to equalize the gains of the signal paths c and d and invert phase. A sub-amp 64 amplifies the output signal of the variable phase shifter 63.

A combiner 65 combines the signal, which has been branched by the brancher 59 and delayed by a delay line 66, with the output signal of the sub-amp. Since control is performed so as to equalize the gains of the signal paths c and d and so as to invert phase, the combiner 65 outputs the difference between the signals that arrive via the paths c and d. The signal path c includes only the distortion-free delay line 66 so that the noise signals and the carrier signals inclusive of the pilot signal enter the combiner 65 as is. Signal path d, on the other hand, inputs the noise components and pilot signal to the combiner 65. As a result, the combiner 66 outputs only the carrier signals in the steady state of feed-forward control.

When feed-forward control is unstable, the carrier signals are not removed and remain in the output of the combiner 60, and the pilot signal is not removed and remains in the output of combiner 65. A detector 67 detects the carrier-signal components contained in the output of the sub-amp 64 and inputs these components to the control unit 52. A detector 68 detects the pilot-signal component contained in the output of the combiner 65 and inputs this component to the control unit 52.

The control unit 52 controls the attenuation and amount of phase shift of the variable attenuator 56 and variable phase shifter 57 in such a manner that the carrier-signal components detected by the detector 67 are minimized, and controls the attenuation and amount of phase shift of the variable attenuator 62 and variable phase shifter 63 in such a manner that the pilot-signal component detected by the detector 68 becomes zero. By thenceforth executing such feed-forward control, an amplified signal from which noise signals ascribable to non-linear distortion have been eliminated can be output from the combiner 65.

When a station is established or a board replaced during operation, it is required to start up the high-power amplifier by introducing power thereto. At startup, the input power detector 51 detects input power and inputs the result to the control unit 52. On the basis of the input power, the control unit 52 determines whether the base-station apparatus is in the blossoming mode or breathing mode and sets the attenuation of the variable attenuator 53 to MIN (minimum) and the gain of the high-power amplifier to MAX (maximum) if the mode is the blossoming mode. As a result, the output power $S_{OUT}$ of the high-power amplifier increases linearly with the passage of time, as indicated in FIG. 1(a). Further, when the input power exceeds the set level VFCC, the control unit 52 starts feed-forward control to compensate for non-linear distortion of the main amp.

If the base-station apparatus is in the breathing mode, on the other hand, the control unit 52 gradually decreases the attenuation of the variable attenuator 53 from MAX to MIN, i.e., gradually increases the gain from MIN to MAX, at prescribed increments of time. As a result, the signal input to the feed-forward control loop gradually increases so that excessive power will not be input to the sub-amp 64 when feed-forward control is unstable. Further, the control unit 52 starts feed-forward control from the outset because input power is greater than the set level $V_{FCC}$ at start-up. The output power $S_{OUT}$ of the high-power amplifier increases linearly with the passage of time, as indicated in FIG. 1(b).

Figure 4:
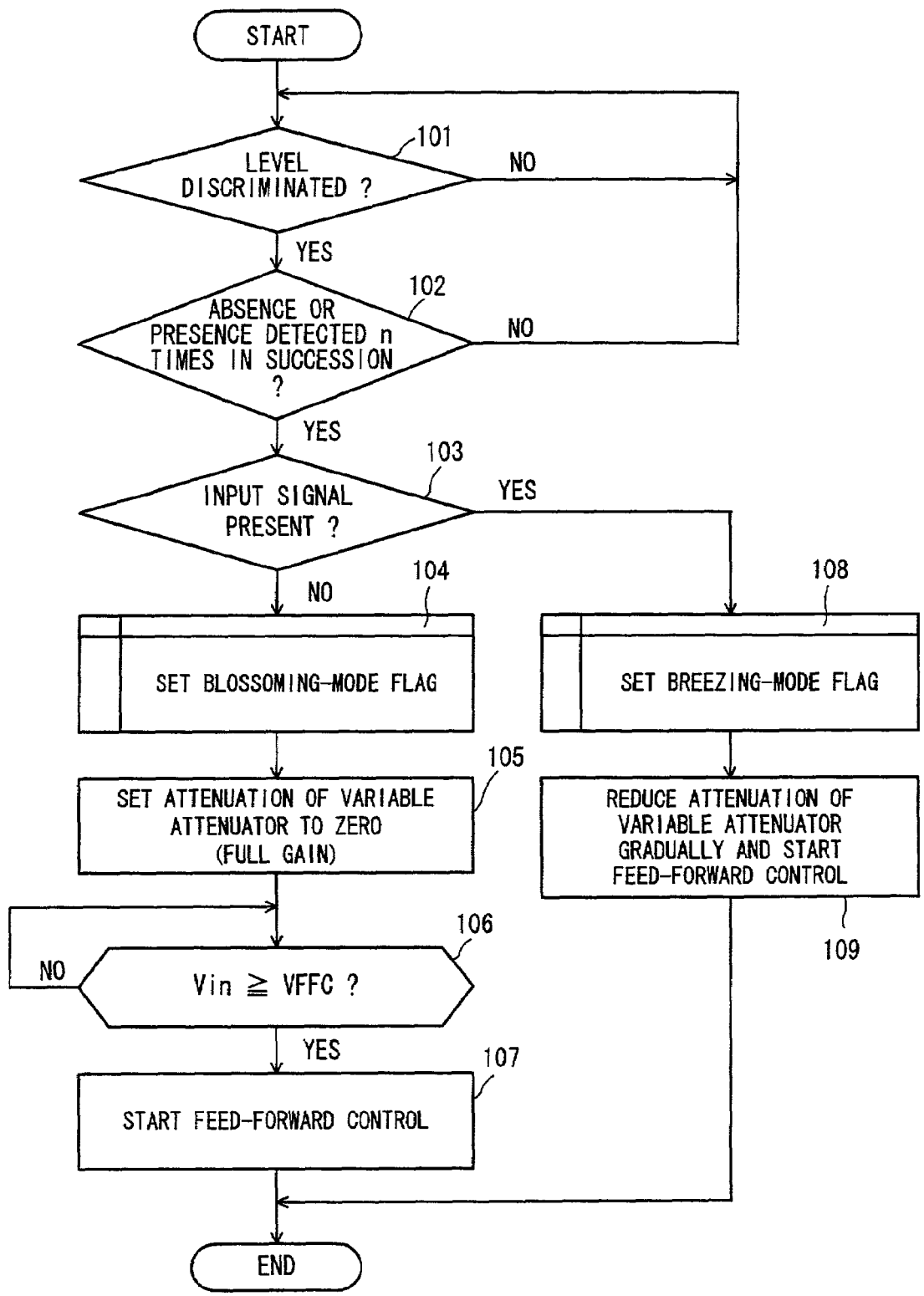
FIG. 4 is a flowchart of processing for discriminating mode and controlling attenuation of a variable attenuator.

FIG. 4 is a flowchart of processing for discriminating mode and controlling attenuation when the high-power amplifier of the first embodiment is started up.

At start-up, the control unit 52 accepts the input power $S_{IN}$, which has been detected by the input power detector 51, at prescribed sampling intervals, and checks to see whether the input power is equal to or greater than a set level ($=V_{MRL}$) (i.e., whether an input signal is present) n times in succession or whether the input power is less than the set level $V_{MRL}$ (i.e., whether an input signal is absent) n times in succession (steps 101, 102). The processing of steps 101, 102 is continued until the same decision is rendered n times in succession.

If the same decision is rendered n times in succession, the control unit checks to see whether the input power is equal to or greater than the set level (whether the input signal is present) n times in succession (step 103). If the decision is "NO", then the control unit sets a blossoming-mode flag (step 104); if the decision is "YES", then the control unit sets a breathing-mode flag (step 108).

Figure 5:
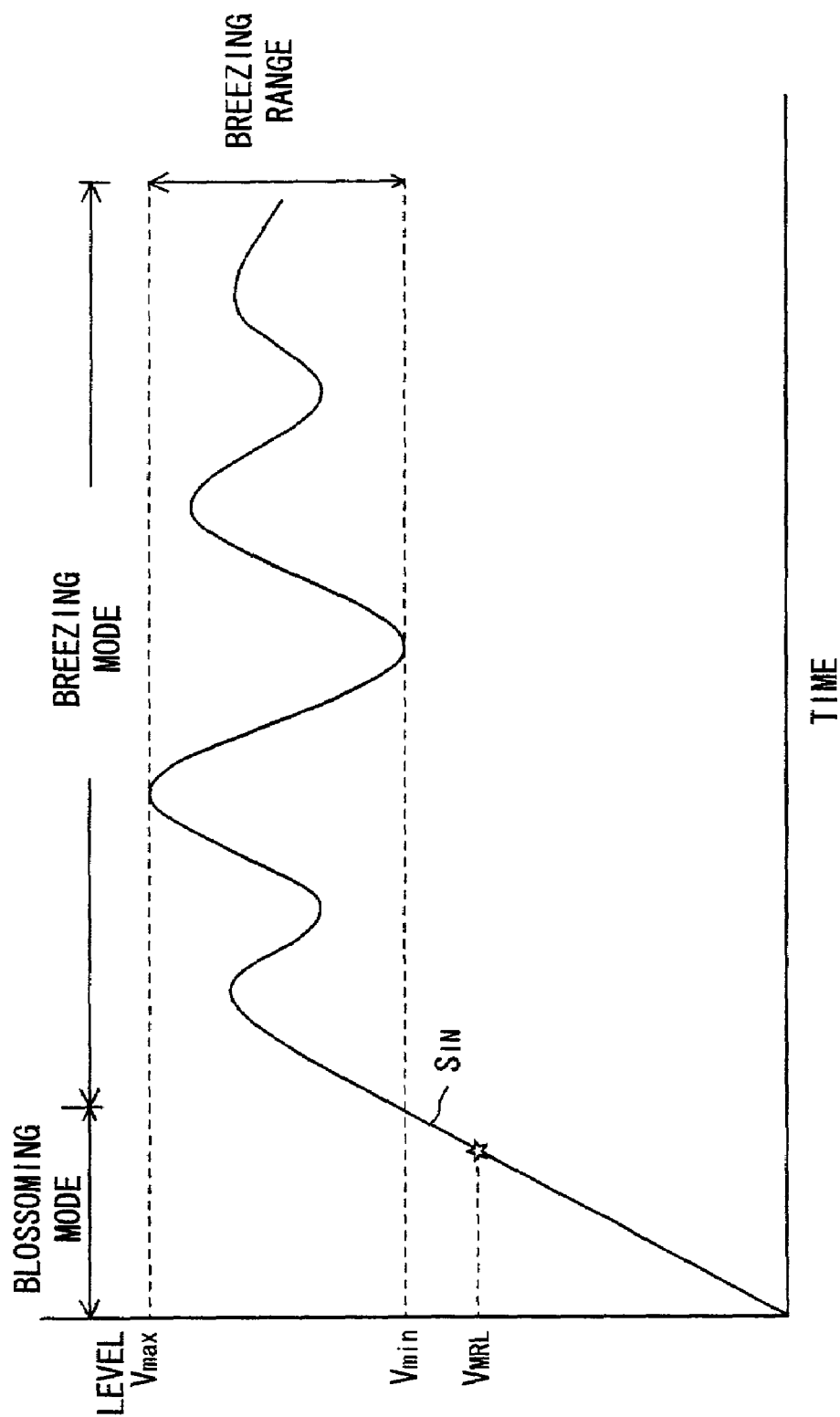
FIG. 5 is a diagram useful in describing level setting for mode discrimination.

Since the mode is discriminated by thus obtaining the same results n times in succession, it is possible to obtain highly reliable mode discrimination results. Further, as shown in FIG. 5, the set level $V_{MRL}$ is adopted as a level outside a range ($V_{min}$~$V_{max}$) in which the level of the input power $S_{IN}$ varies in the blossoming mode. If the set level $V_{MRL}$ is thus decided, mode discrimination can be carried out with certainty even during the power control operation.

If the result of the check at step 103 is that the base station is in the blossoming bode, the control unit sets the attenuation of the variable attenuator 53 to MIN and sets the gain of the high-power amplifier to MAX (step 105). Next, the control unit checks to see whether the input power level $V_{in}$ is equal to or greater than the set level $V_{FCC}$ (step 106). If the input signal level rises (see FIG. 1A) and $V_{in} \geq V_{FCC}$ is established owing to blossoming control, then the control unit starts feed-forward control (step 107).

If the base station is in the breathing mode, on the other hand, the control unit 52 reduces the attenuation of the variable attenuator 53 gradually from MAX to MIN. As a result, the gain of the high-power amplifier rises gradually from MIN to MAX in proportion to the passage of time. If the mode is the breathing mode, the input signal level $V_{in}$ is equal to or greater than the set level $V_{FCC}$ and, hence, the control unit starts feed-forward control at the same time as gain control (step 109).

Thus, in accordance with the first embodiment, the output power (transmission power) $S_{OUT}$ of the high-power amplifier can be increased in proportion to the passage of time when a station is established (i.e., at the time of blossoming). Further, at the time of operation (breathing), the gain of the high-power amplifier is increased from low to full gain gradually. As a result, excessive power will not be input to the sub-amp, thereby making it possible to protect the same, when feed-forward control is unstable.

(C) Second Embodiment

Figure 6:
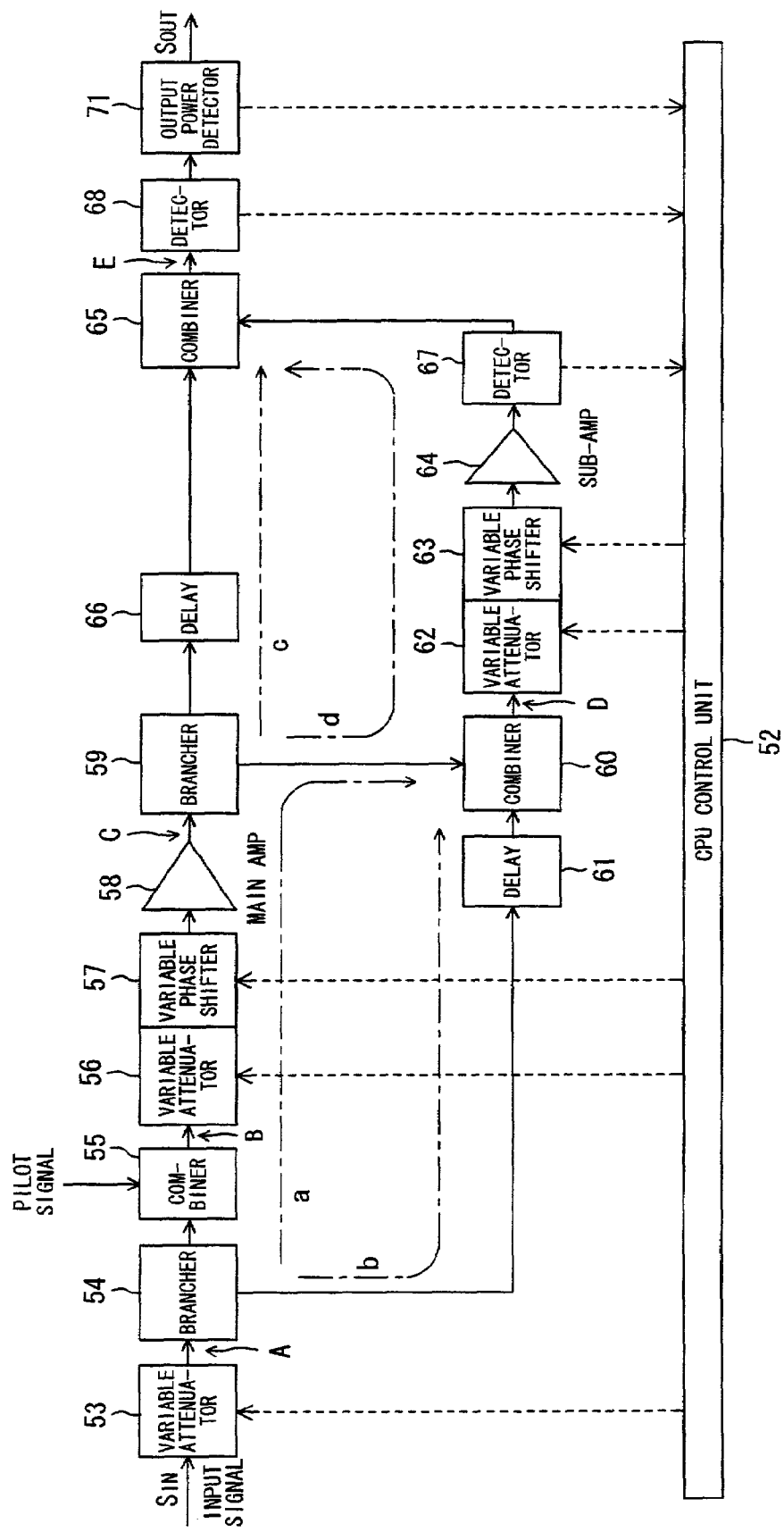
FIG. 6 is a diagram showing the structure of a high-power amplifier according to a second embodiment.

FIG. 6 is a diagram showing the structure of a high-power amplifier (HPA) according to a second embodiment of the present invention. Components identical with those of the first embodiment of FIG. 2 are designated by like reference characters. This embodiment differs from the first embodiment in that:

(1) an output power detector 71 is provided instead of the input power detector 51;

(2) the control unit 52 converts the detected value from the output power detector 71 to input power based upon the gain of the high-power amplifier; and (3) mode discrimination and attenuation control (gain control) are carried out in accordance with the flowchart of FIG. 4 based upon the input power obtained by the conversion.

Figure 7:
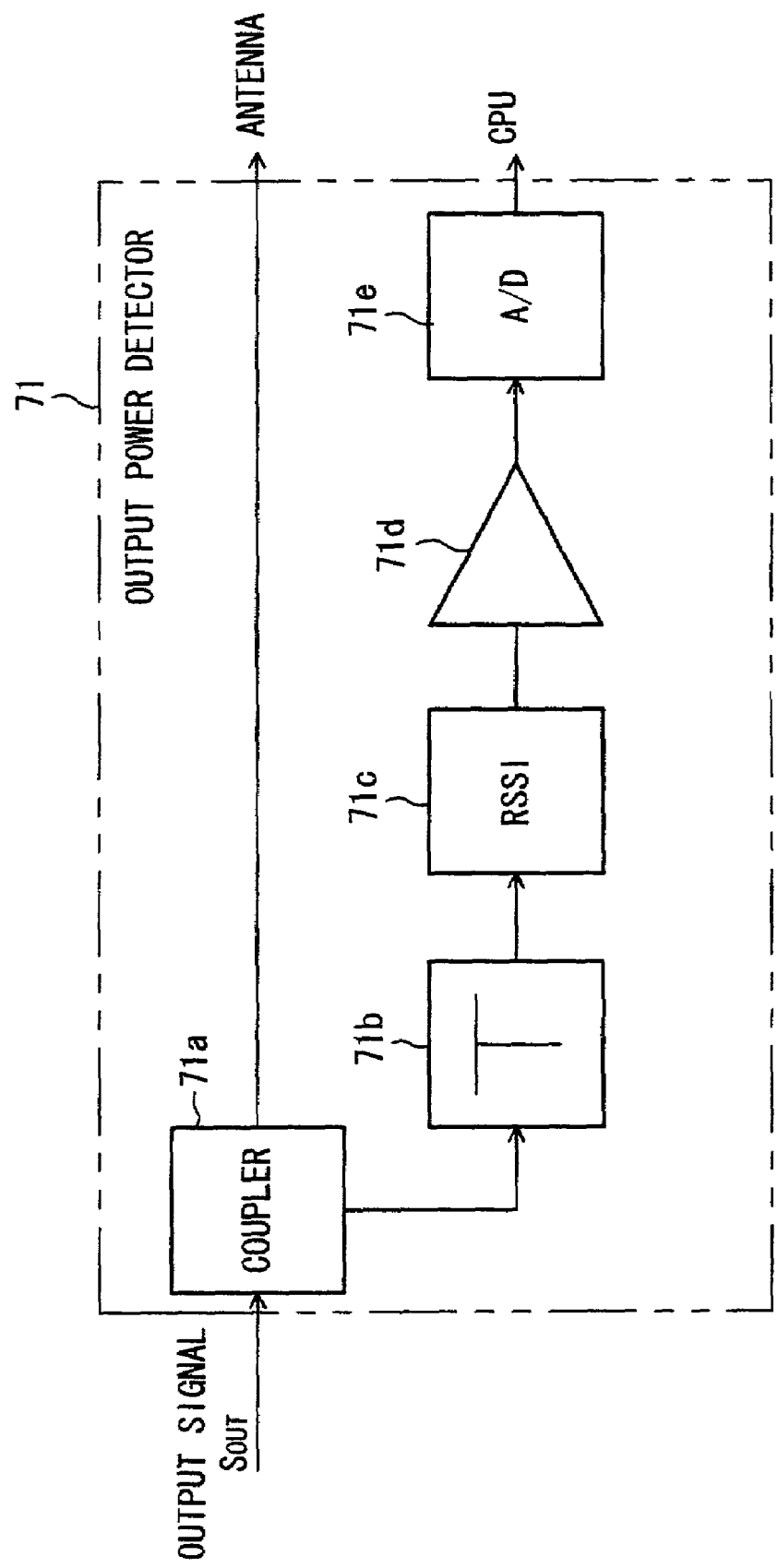
FIG. 7 is a diagram showing the structure of a level detector provided on an output side.

As shown in FIG. 7, the output power detector 71 has a structure identical with that of the input power detector 51 of the first embodiment. The output power $S_{OUT}$ is branched by a coupler 71a such as a unidirectional coupler, and one branched signal is input to the antenna side. The other branched signal is input to an RSSI circuit 71c via an isolator 71b. The RSSI circuit 71c converts the output signal to voltage and inputs the voltage to an amplifier 71d, where the signal is subjected to the necessary amplification and then input to an AD converter 71e. The AD converter 71e converts the input voltage to a digital signal and inputs the digital signal to the control unit 52.

(D) Third Embodiment

Figure 8:
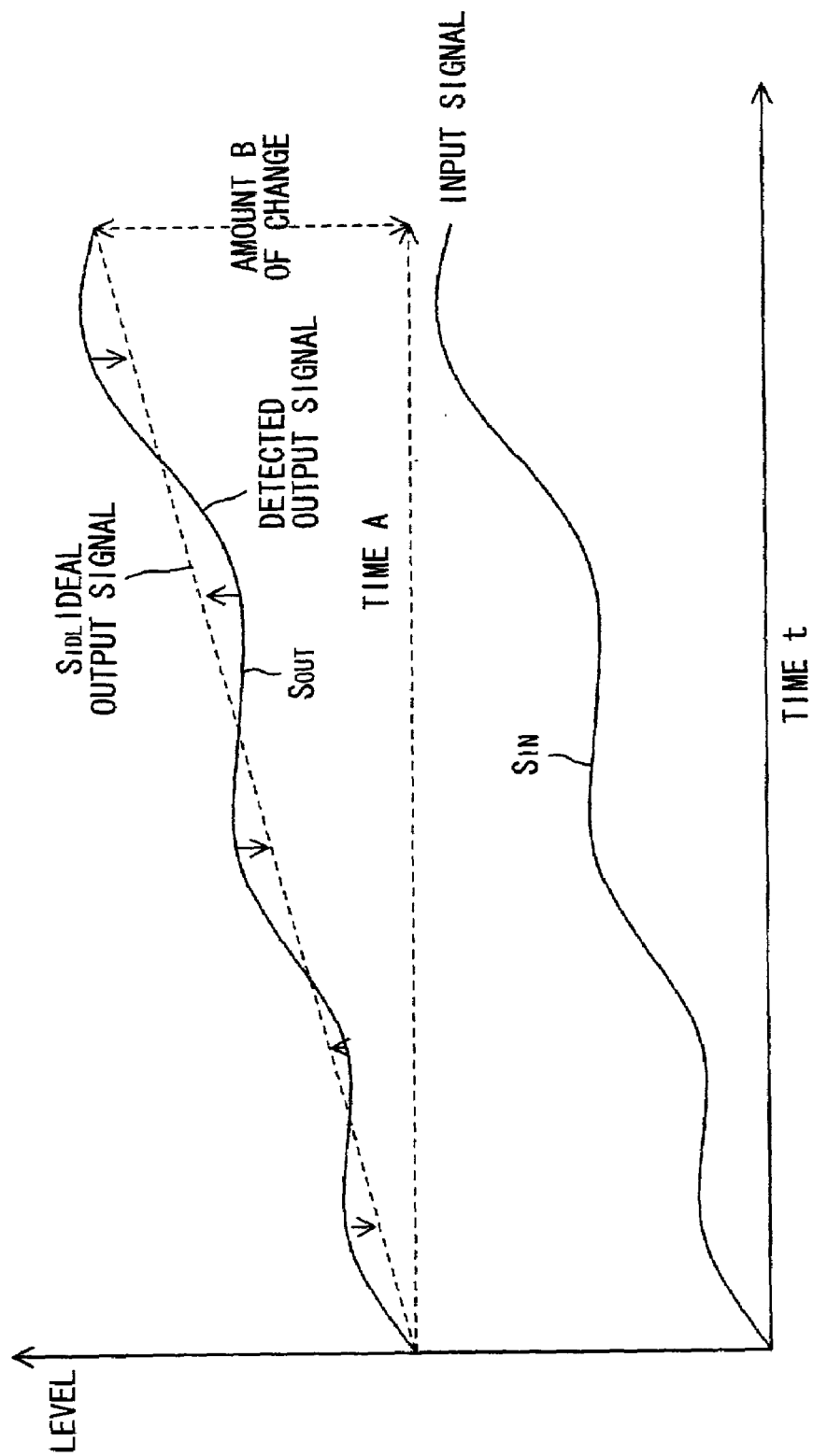
FIG. 8 is a diagram useful in describing problems regarding non-linear input.

When the blossoming mode is in effect, there are instances where the input power $S_{IN}$ to the high-power amplifier fluctuates for some reason, as shown in FIG. 8. In such case the output power $S_{OUT}$ of the high-power amplifier also will fluctuate in the manner indicated, the transmission power of the base station will no longer vary linearly with respect to time and it will no longer be possible to exercise the original power control that attempts to enlarge the cell (the transmission area) gradually in proportion to time. Accordingly, it is necessary to control the transmission power of the base station in the manner indicated by the dashed line $S_{IDL}$.

Figure 9:
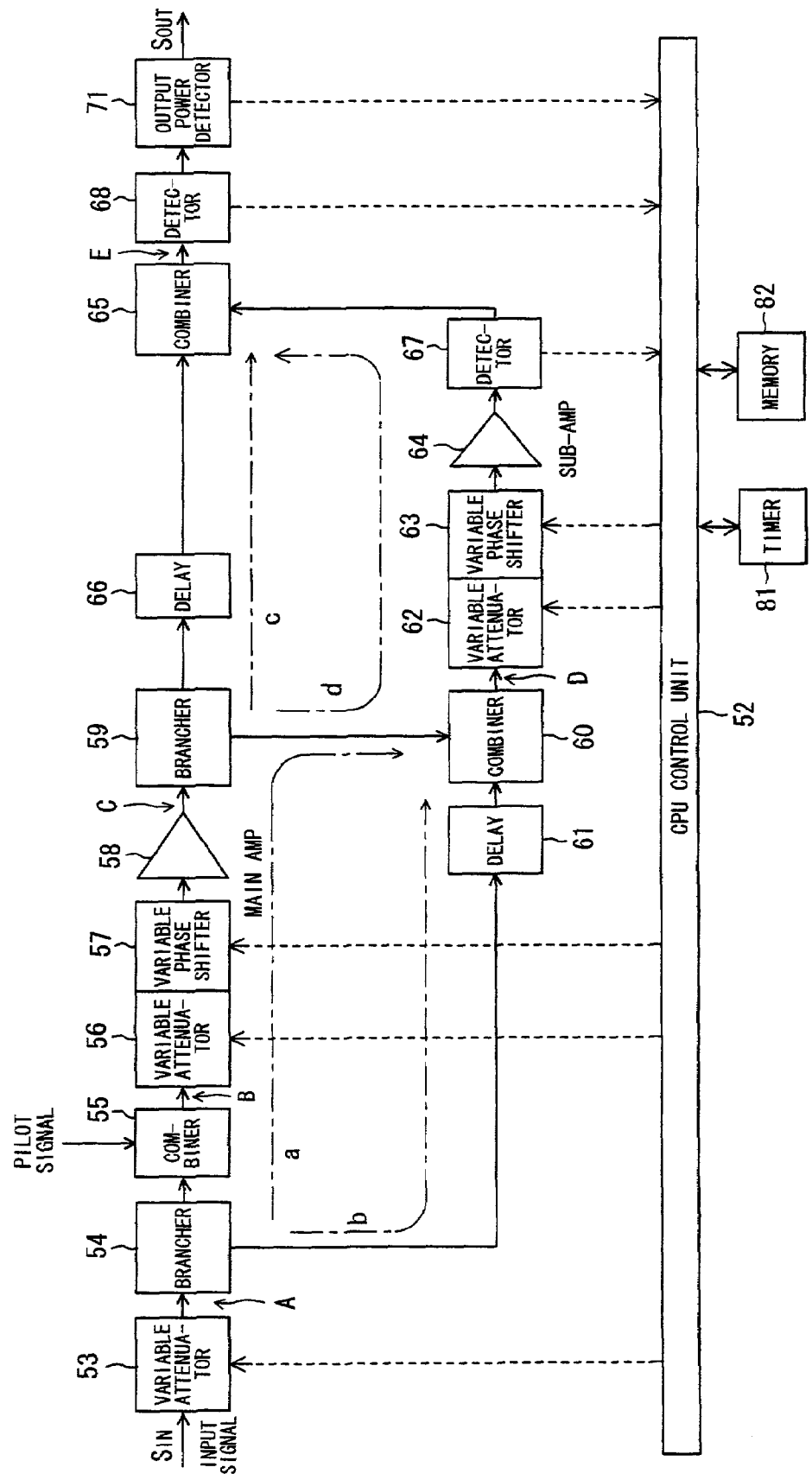
FIG. 9 is a diagram showing the structure of a high-power amplifier according to a third embodiment.

FIG. 9 is a diagram showing the structure of a high-power amplifier according to a third embodiment for controlling transmission power linearly with respect to a non-linear input. Components identical with those of the second embodiment of FIG. 6 are designated by like reference characters. This embodiment differs from the second embodiment in that:

(1) a timer 81 for monitoring elapsed time following the start of blossoming control is provided;

(2) a memory 82 is provided for storing the correspondence (see FIG. 10) between elapsed time and ideal values of transmission power in an ideal transmission power characteristic (the dashed line in FIG. 8); and (3) in the blossoming mode, the control unit 52 exercises control in such a manner that transmission power is increased in proportion to the passage of time.

Figure 11:
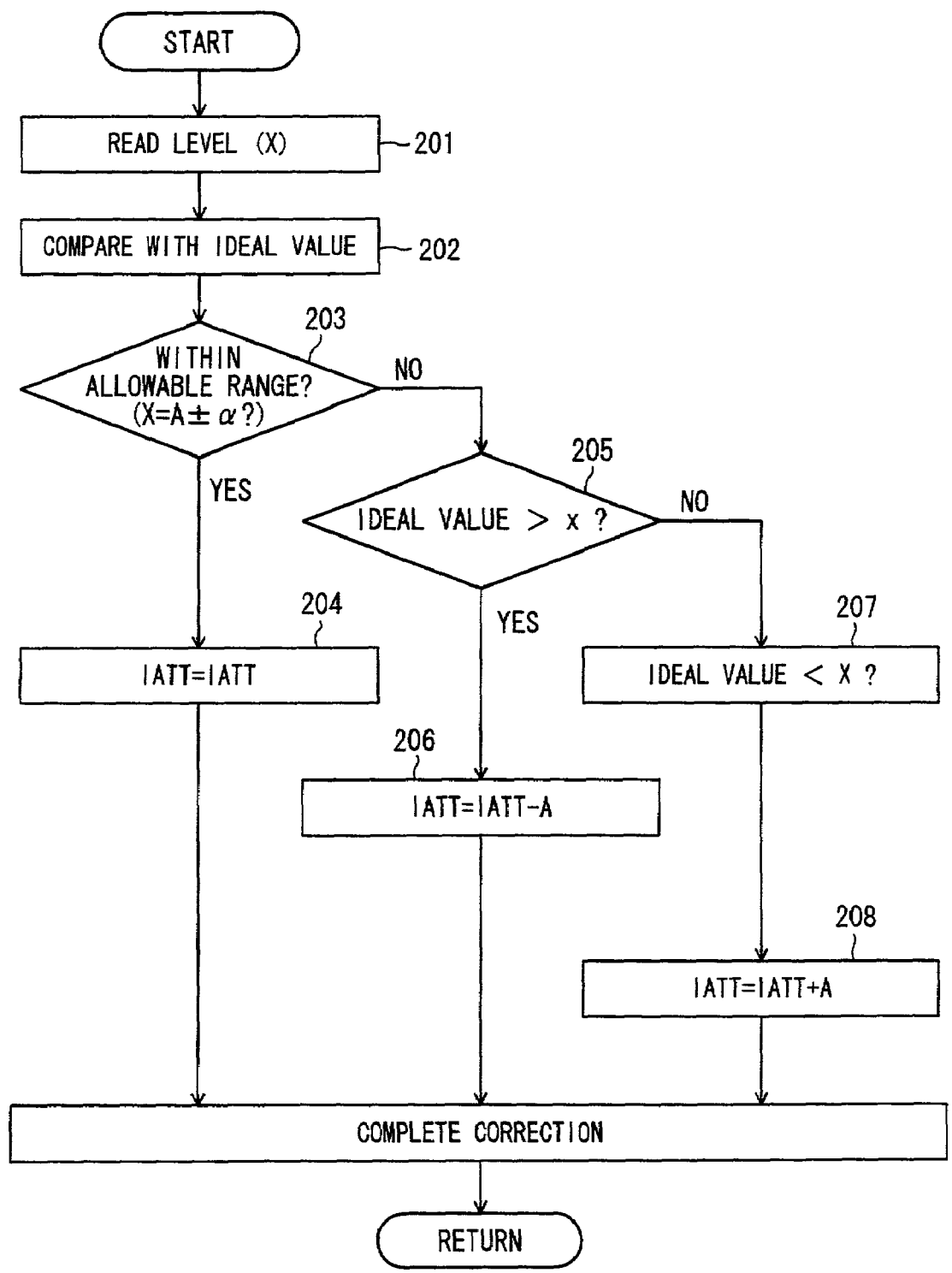
FIG. 11 is a flowchart of processing for controlling transmission power according to the third embodiment.
Figure 12:
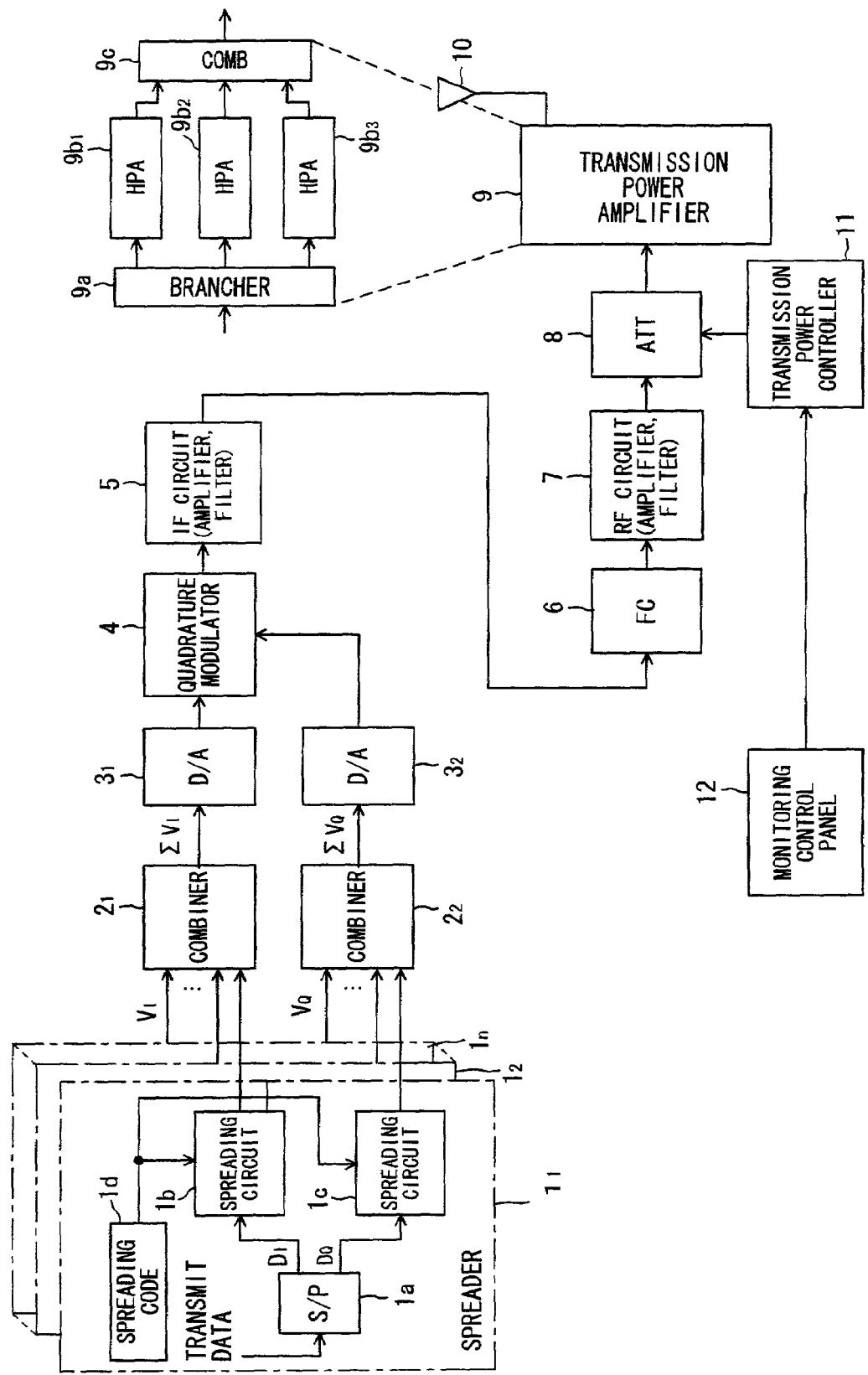
FIG. 12 is a diagram showing the structure of a CDMA transmitter in a base-station apparatus.
Figure 13:
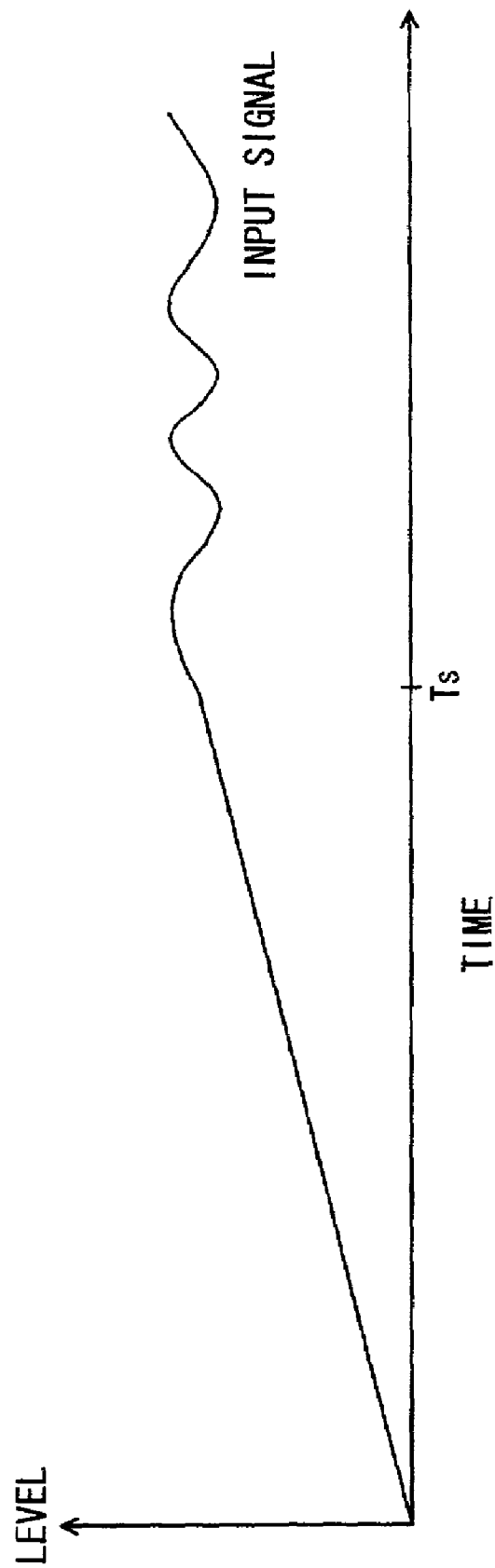
FIG. 13 is a diagram useful in describing useful in describing control of transmission power when a station is established.
Figure 14B:
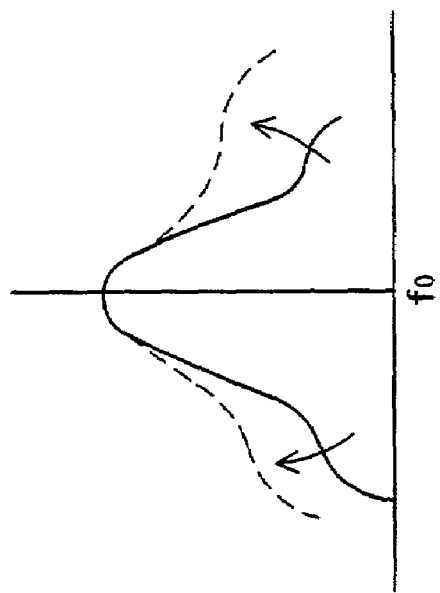
FIG. 14A and FIG. 14B are input/output characteristic diagrams of a transmission power amplifier.
Figure 14A:
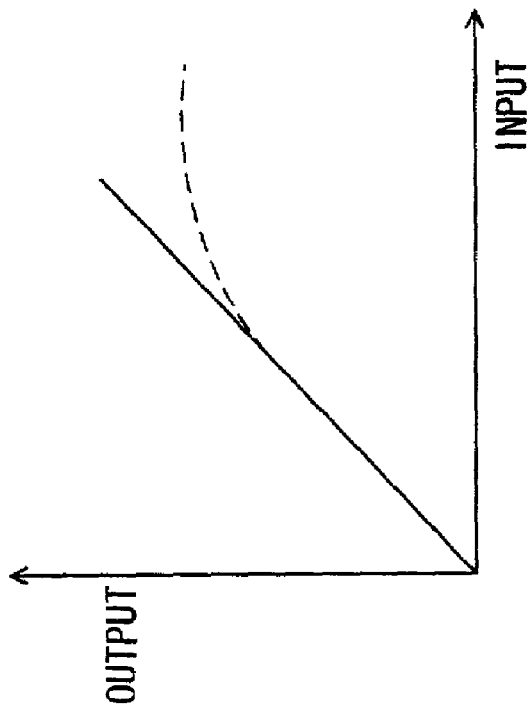
Figure 15:
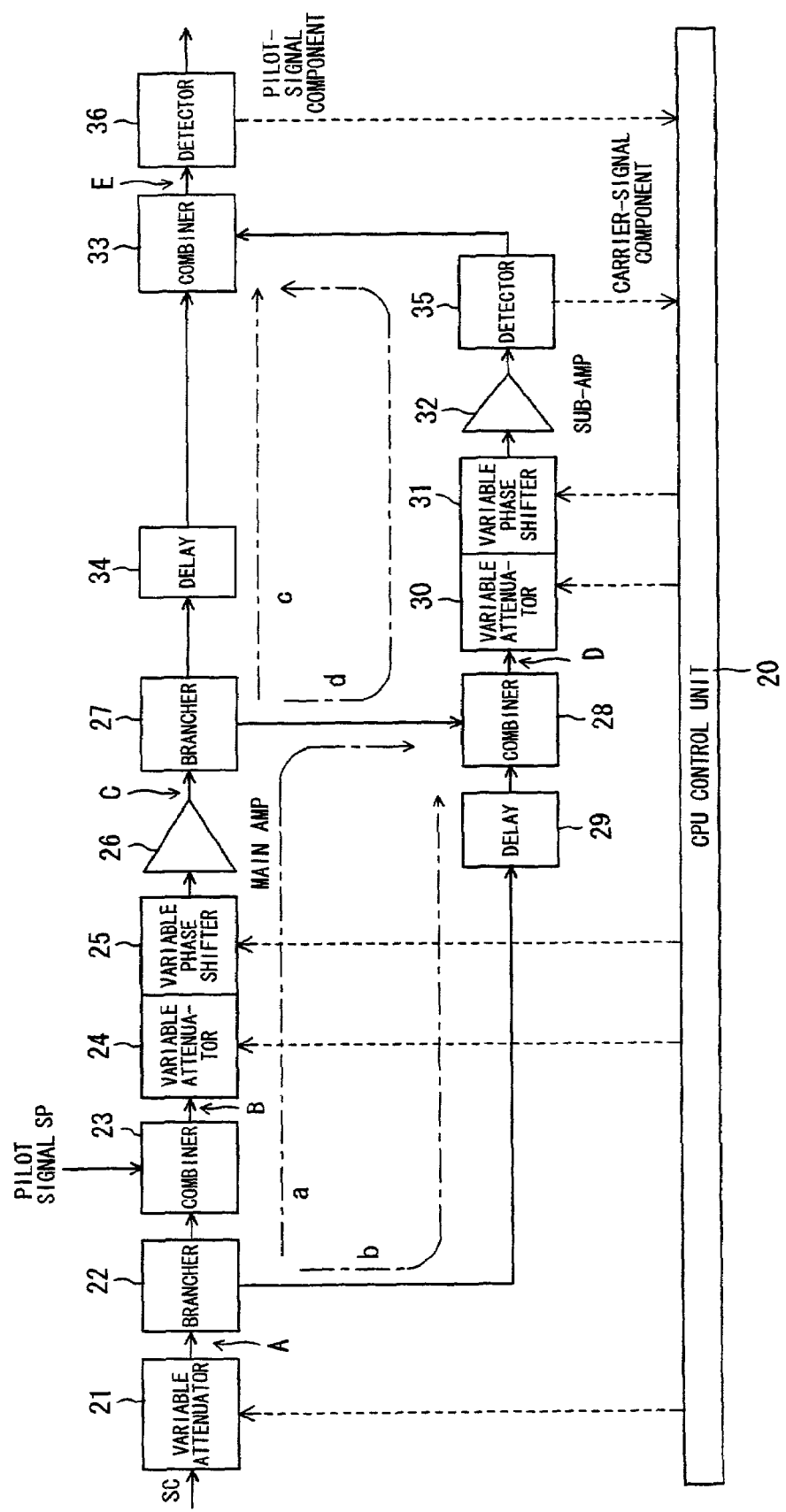
FIG. 15 is a diagram showing a feed-forward control arrangement.
Figure 16:
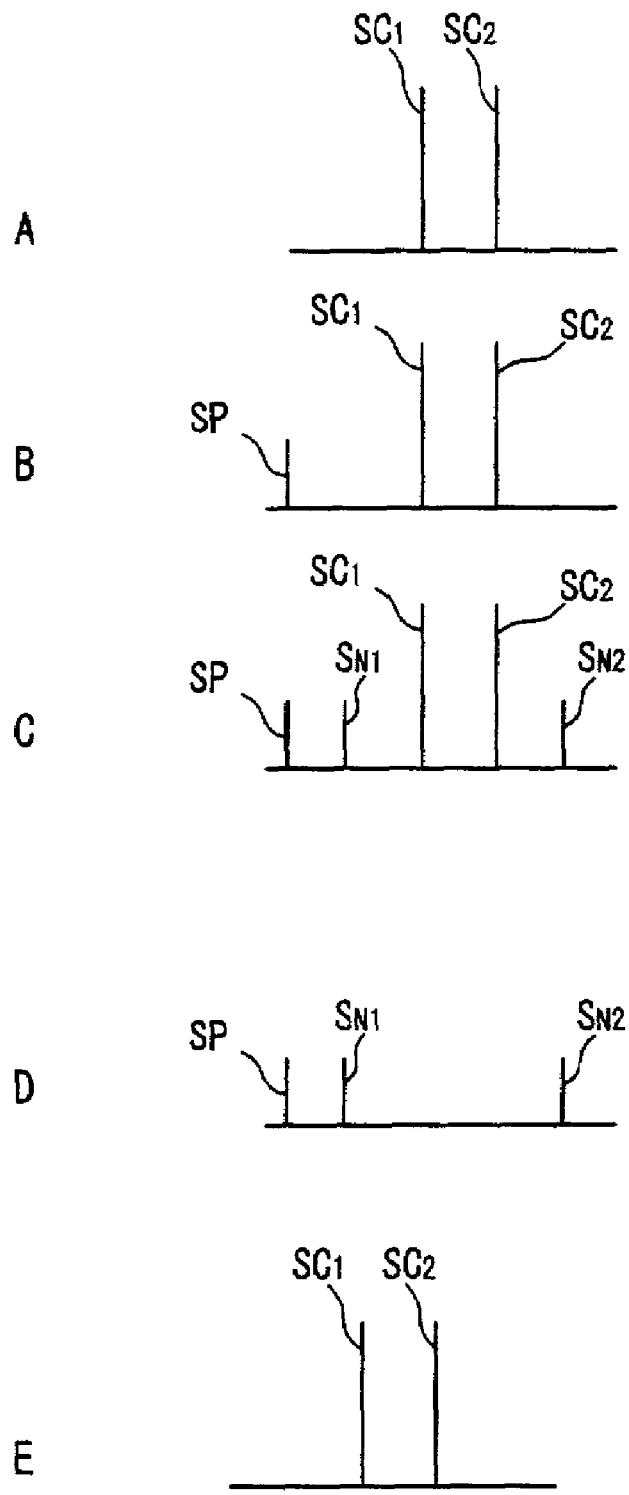
FIG. 16 is a diagram useful in describing spectra at various portions in FIG. 15.
Figure 17:
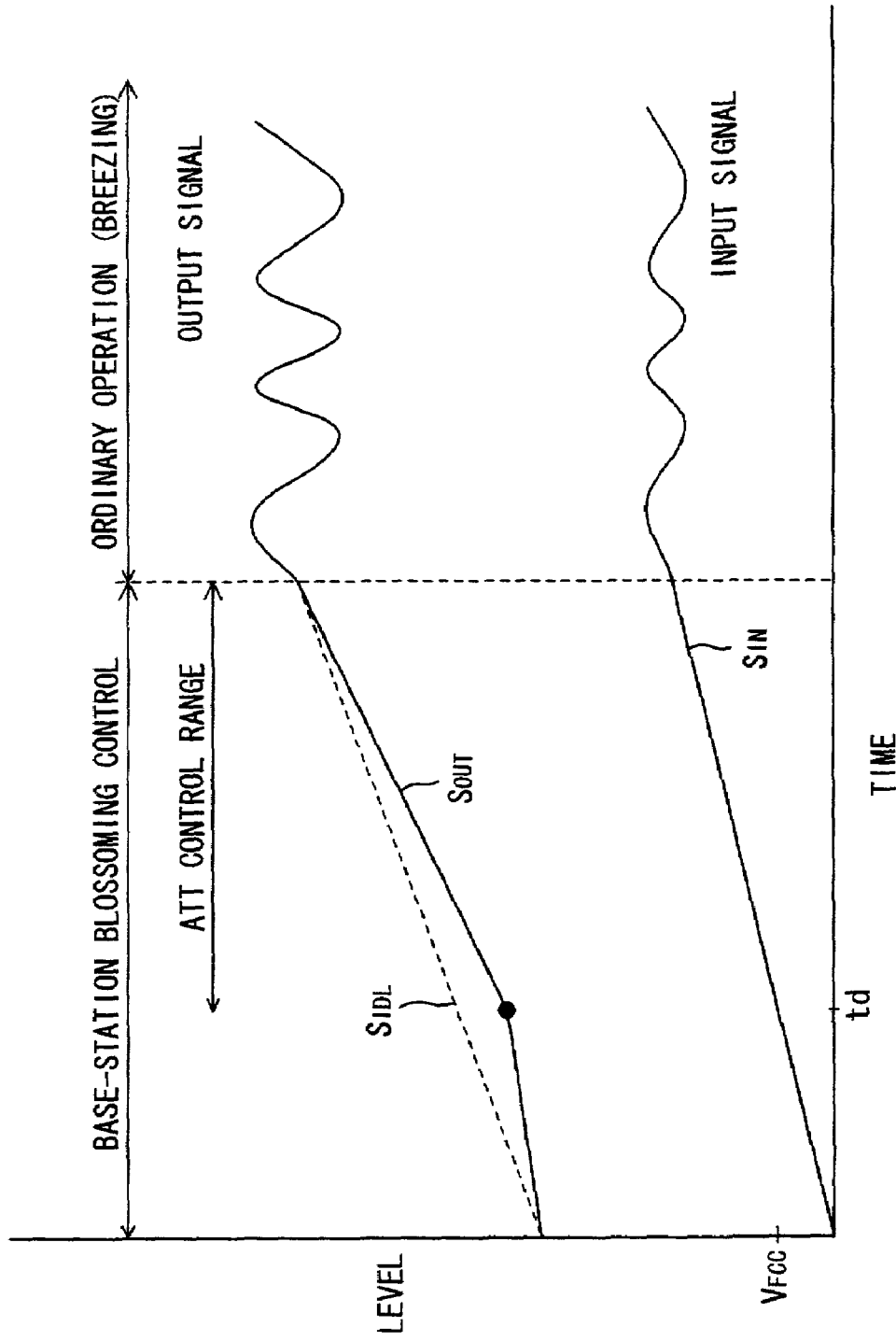
FIG. 17 is a diagram useful in describing an input signal and an output signal.

FIG. 11 is a flowchart of processing for controlling transmission power according to the third embodiment.

At time t following the start of blossoming control, the control unit 52 reads an output-signal level X from the output power detector 71 (step 201), reads an ideal value A of the output-signal level at this time from memory and compares the detected value and the ideal value (step 202). Next, the control unit checks to see whether the detected level is within an allowable range, i.e,. whether the following equation is satisfied (step 203):

$$A-\alpha<X<A+\alpha \qquad (1)$$

If the equation is satisfied, the control unit 52 does not correct attenuation IATT of the variable attenuator 53 (step 204).

If Equation (1) is not satisfied at step 203, then the control unit checks to see whether (ideal value A)>(detected value X) holds (step 205). If A>X holds, the control unit reduces the attenuation (IATT=IATT−A). That is, the gain is raised so that the detected value X increases (step 206). If A<X holds (step 207), on the other hand, then the control unit enlarges the attenuation (IATT=IATT+A). That is, the gain is lowered so that the detected value X decreases (step 208). As a result of the foregoing, correction processing is completed and then processing from step 201 onward is repeated.

In the foregoing, mode is detected based upon the level of a signal (input power) input to a high-power amplifier when power is introduced, and the gain of the high-power amplifier is controlled (full-gain control, control for raising gain gradually) based upon the mode. However, it can be so arranged that at the time of a test or the like, the mode is set based upon an externally applied command and full-gain control and control for raising gain gradually is carried out based upon the set mode.

Thus, in accordance with the present invention, when a base station is established, transmission power can be controlled linearly with respect to time and cell radius can be varied gradually at a fixed amount. As a result, (1) concentration of load in call processing can be avoided, (2) the outputs of transceivers (base station and terminals) can be controlled smoothly, and (3) it is possible to mitigate the effects on terminals within the cell and on other base stations when a station is established. Further, a transmittable area and a receivable area can both be enlarged linearly and equalized.

Further, in accordance with the present invention, when it is necessary to replace a high-power amplifier (HPA) during operation, excessive power will not enter a sub-amp owing to input attenuator control of the HPA per se even if the input level is near the maximum value of the rated level, and the high-power amplifier can be started up by optimum feed-forward control.

What is claimed is:

1. A transmission power amplifier unit, which has a transmission power amplifier and provided in a base-station apparatus, for compensating for non-linear distortion of the transmission power amplifier by feed-forward control, comprising:

a gain varying unit for varying gain of the transmission power amplifier unit; and a controller which, at start-up of the transmission 10 power amplifier unit, is for determining whether the base-station apparatus is in a blossoming mode or breathing mode, maximizing gain of the transmission power amplifier unit if the mode is the blossoming mode and increasing the gain of the transmission power amplifier unit gradually if the mode is the breathing mode, wherein said controller confirms a mode on the condition that the same mode is discriminated a plurality of times in succession.

2. A transmission power amplifier unit according to claim 1, wherein said gain varying unit is an attenuator the attenuation of which is variable, and said controller increases the gain of the transmission power amplifier unit gradually by gradually decreasing the attenuation of said attenuator.

3. A transmission power amplifier unit according to claim 1, wherein said controller includes:

a detection circuit provided in an input section of the transmission power amplifier unit for detecting input power; and means for discriminating mode based upon whether said input power is equal to or greater than a threshold level.

4. A transmission-power amplifier unit according to claim 1, wherein said controller includes:

a detection circuit provided in an output section of the transmission power amplifier unit for detecting output power; and means for discriminating mode based upon said output power value.

5. A transmission power amplifier unit according to claim 3, wherein a predetermined level within a range in which input power varies in the blossoming mode is adopted as said threshold level.

6. A transmission power amplifier unit, which has a transmission power amplifier and provided in a base-station apparatus, for compensating for non-linear distortion of the transmission power amplifier by feed-forward control, comprising:

a gain varying unit for varying gain of the transmission power amplifier unit;

a controller which, at start-up of the transmission 10 power amplifier unit, is for determining whether the base-station apparatus is in a blossoming mode or breathing mode, maximizing gain of the transmission power amplifier unit if the mode is the blossoming mode and increasing the gain of the transmission power amplifier unit gradually if the mode is the breathing mode;

a memory for storing correspondence between time from start of control in the blossoming mode and an ideal output value of the transmission power amplifier unit;

a detector circuit for output power of the transmission power amplifier unit; and a timer for monitoring time from start of blossoming control;

said controller controls said gain varying unit in such a manner that the difference between an ideal value and a detected value at the present time becomes zero.

7. A base-station control apparatus provided with a transmission power amplifier unit, which has a main amplifier and a sub-amplifier, for compensating distortion of the main amplifier by feed-forward control using a signal output from the sub-amplifier, comprising:

a controller controlling a gain of the transmission power amplifier unit to be constant at a predetermined value in a blossoming mode, wherein in the blossoming mode cell radius is enlarged at a fixed rate by increasing gradually a level of a signal input to the transmission power amplifier unit, from a value below a set level; and a gain varying unit varying gain of the transmission power amplifier unit, wherein the controller determines whether the base-station apparatus is in the blossoming mode or breathing mode and increases the gain of the transmission power amplifier unit gradually if the mode is breathing mode wherein said controller confirms a mode on the condition that the same mode is discriminated a plurality of times in succession.

* * * * *